(12) United States Patent
Araki

(10) Patent No.: US 8,502,083 B2
(45) Date of Patent: Aug. 6, 2013

(54) MOUNTING SUBSTRATE AND ELECTRONIC DEVICE

(75) Inventor: Yasushi Araki, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 1580 days.

(21) Appl. No.: 11/962,215

(22) Filed: Dec. 21, 2007

(65) Prior Publication Data
US 2008/0251283 A1    Oct. 16, 2008

(30) Foreign Application Priority Data

Dec. 25, 2006    (JP) .................................. 2006-347993

(51) Int. Cl.
*H05K 1/16*    (2006.01)
(52) U.S. Cl.
USPC ........................................................ 174/260
(58) Field of Classification Search
USPC .................. 174/257, 260; 257/787–796, 782, 257/778, 780; 361/760–764
See application file for complete search history.

(56) References Cited

U.S. PATENT DOCUMENTS

| 7,307,221 B2 * | 12/2007 | Pan ............................... 174/260 |
| 2006/0049522 A1 * | 3/2006 | Libres et al. ................... 257/738 |
| 2007/0045870 A1 * | 3/2007 | Kuramochi .................... 257/782 |

FOREIGN PATENT DOCUMENTS

| JP | 2005-276879 | 10/2005 |
| JP | 2006-140327 | 6/2006 |

OTHER PUBLICATIONS

Machine Translation of JP 2005-276879, Naoto Sasaki (Oct. 6, 2005).*

* cited by examiner

*Primary Examiner* — Jeremy Norris
*Assistant Examiner* — Tremesha S Willis
(74) *Attorney, Agent, or Firm* — Rankin, Hill & Clark LLP

(57) ABSTRACT

A mounting substrate includes: a mounting area on which an electronic element is mounted; an electrode forming area on which electrodes are formed and which is formed to surround the mounting area; and a dam member which is formed on a boundary between the mounting area and the electrode forming area so as to block flow out of a filling material being filled between the electronic element and the mounting substrate, into the electrode forming area, wherein recess portions that face the electrodes are formed on an outer peripheral surface of the dam member and a part of the electrodes are formed within the recess portions.

13 Claims, 4 Drawing Sheets

MOUNTING SUBSTRATE AND ELECTRONIC DEVICE

This application is based on and claims priority from Japanese Patent Application No. 2006-347993, filed on Dec. 25, 2006, the entire contents of which are hereby incorporated by reference.

BACKGROUND OF THE INVENTION

1. Technical Field

The present disclosure relates to a mounting substrate and an electronic device and, more particularly, a mounting substrate and an electronic device having a dam to suppress a flow of an underfill material.

2. Background Art

Recently, as the method of mounting an electronic element such as a semiconductor chip on a mounting substrate, flip-chip mounting is used frequently. The flip-chip mounting is such a method that bumps are formed on a mounting surface of the electronic element and then the electronic element is face-down bonded to electrodes formed on the mounting substrate.

In this flip-chip mounting, the electronic element and the mounting substrate are bonded by bonding force between the bumps and the electrodes. Thus, once a stress is generated between the electronic element and the mounting substrate, this stress is applied wholly to bonded positions between the bumps and the electrodes. Therefore, in this flip-chip mounting, normally an underfill resin (an epoxy resin is often used) is filled between the electronic element and the mounting substrate to attain the stress relaxation.

Meanwhile, a higher packaging density is desired in the electronic device such as the semiconductor device, or the like. As the package that meets this higher packaging density, much attention is focused on the system in package (SiP). Various structures have been proposed as this SiP. As one type of such structures, there is the package on package (PoP) that realizes the SiP structure by stacking the package (semiconductor device) in which a single semiconductor chip is packaged and the package in which a plurality of semiconductor chips are stacked.

In the case of SiP having this PoP structure, normally the package serving as the lower layer and the package serving as the upper layer are bonded mutually using the solder balls. Therefore, in the package serving as the lower layer, the electrodes that are bonded to the solder balls must be formed on an upper surface of the mounting substrate on which the semiconductor chip is mounted. That is, both the chip mounting area on which the semiconductor chip is mounted and the electrode forming area in which the electrodes are formed are formed on the upper surface of the mounting substrate constituting the package serving as the lower layer. Since usually the electrodes are arranged to surround the semiconductor chip, the electrode forming area is arranged to surround the chip mounting area.

Here, when the package serving as the lower layer has such a structure that the semiconductor chip is flip-chip mounted, the underfill resin must be filled between the semiconductor chip and the mounting substrate to attain the stress relaxation, as described above. However, since the underfill resin has a flowability during the filling operation, it is feared that such underfill resin flows out from the chip mounting area into the electrode forming area.

For this reason, the dam member for blocking flow out of the underfill resin from the chip mounting area into the electrode forming area is provided between the chip mounting area and the electrode forming area in the related-art (see e.g., Japanese Unexamined Patent Publication: JP-A-2005-276879).

FIGS. 4A and 4B show an example of a mounting substrate having the dam member in the related-art. FIG. 4A is a view showing a forming position and its neighborhood of a dam member 105 of a mounting substrate 100 in an enlarged fashion, and FIG. 4B is a sectional view of the same.

A dam member 105 is formed between an electrode forming area 103 in which electrodes 101 are formed and a chip mounting area 102 on which a semiconductor chip (not shown) is mounted, as described above. In the electrode forming area 103, the electrodes 101 are exposed from the openings formed in a solder resist 104. Also, the underfill resin is filled in the chip mounting area 102 after the semiconductor chip is mounted.

According to the related-art, the dam member 105 is formed like a frame shape. Also, the dam member 105 and the electrodes 101 are arranged relatively distantly in the past when the requested packaging density is not so higher than the recent year.

However, there is a tendency recently that the semiconductor chip is increasing in size according to its greater functionality, and thus the number of terminals tends to increase. In contrast, as to the mounting substrate on which the semiconductor chip is mounted, a smaller area is desired to meet a demand for size reduction of the electronic device that is mounted on the mounting substrate.

Therefore, with respect to the chip mounting area 102 and the electrode forming area 103 formed on the mounting substrate, the chip mounting area 102 must be increased in area in response to an increase of size of the semiconductor chip, and also the electrode forming area 103 must be increased in area in response to an increase of the number of electrodes. In addition, the mounting substrate 100 must be reduced in area as a whole, as described above.

In the related-art, such a problem existed that this mounting substrate 100 cannot meet respective requests at the same time. Also, as the means for fulfilling these requests, it may be considered that a width of the dam member 105 should be narrowed. However, when a width of the dam member 105 is narrowed, a bonded area of the dam member 105 to a substrate body 100a is narrowed and correspondingly a mechanical strength is lowered. As a result, the dam member 105 is damaged in filling the underfill resin, and thus it is feared that flow out of the underfill resin into the electrode forming area 103 cannot be prevented effectively.

SUMMARY OF THE INVENTION

The present invention has been achieved in view of the above problems and, an object of the present invention provides a mounting substrate and an electronic device, capable of achieving an area increase of an electrode forming area and a mounting area while maintaining strength of a dam member.

In order to solve the above problem, the present invention is achieved by respective means as follows.

According to a first aspect of the present invention, a mounting substrate comprises:

a mounting area on which an electronic element is mounted;

an electrode forming area on which electrodes are formed and which is formed to surround the mounting area; and a dam member which is formed on a boundary between the mounting area and the electrode forming area so as to block flow out of a filling material being filled between the electronic element and the mounting substrate, into the electrode forming area, wherein recess portions that face the electrodes are formed on an outer peripheral surface of the dam member and a part of the electrodes are formed within the recess portions.

According to a second aspect of the present invention, a first width dimension of the dam member in a position other than a position where the recess portions are formed may be larger than a second width dimension of the dam member in the position where the recess portions are formed.

According to a third aspect of the present invention, a solder resist may be formed on a substrate body of the mounting substrate and the dam member may be formed of the same material as the solder resist.

According to a fourth aspect of the present invention, a clearance between the recess portion and the electrode facing the recess portion may be set equal respectively within an area where the recess portion and the electrode face each other.

According to a fifth aspect of the present invention, an inner peripheral surface of the dam member that faces the mounting area may be formed into a linear shape.

According to a sixth aspect of the present invention, the filling material may be an underfill resin.

According to a seventh aspect of the present invention, an electronic device comprises:

an electronic element;

a mounting substrate; and a filling material being filled between the electronic element and the mounting substrate, wherein the mounting substrate includes:

a mounting area on which the electronic element is mounted;

an electrode forming area on which electrodes are formed and which is formed to surround the mounting area; and a dam member which is formed on a boundary between the mounting area and the electrode forming area so as to block flow out of the filling material into the electrode forming area, wherein p1 recess portions that face the electrodes are formed on an outer peripheral surface of the dam member and a part of the electrodes are formed within the recess portions.

According to the present invention, recess portions that face the electrodes are formed on an outer peripheral surface of the dam member and a part of the electrodes are formed within the recess portions. Therefore, a part of the dam member can be configured to intrude into the electrode forming area, and an area of the mounting area can be increased correspondingly.

DETAILED DESCRIPTION OF EXEMPLARY EMBODIMENTS

Next, the exemplary embodiments will be described in details with reference to the drawings hereinafter.

Figure 1:
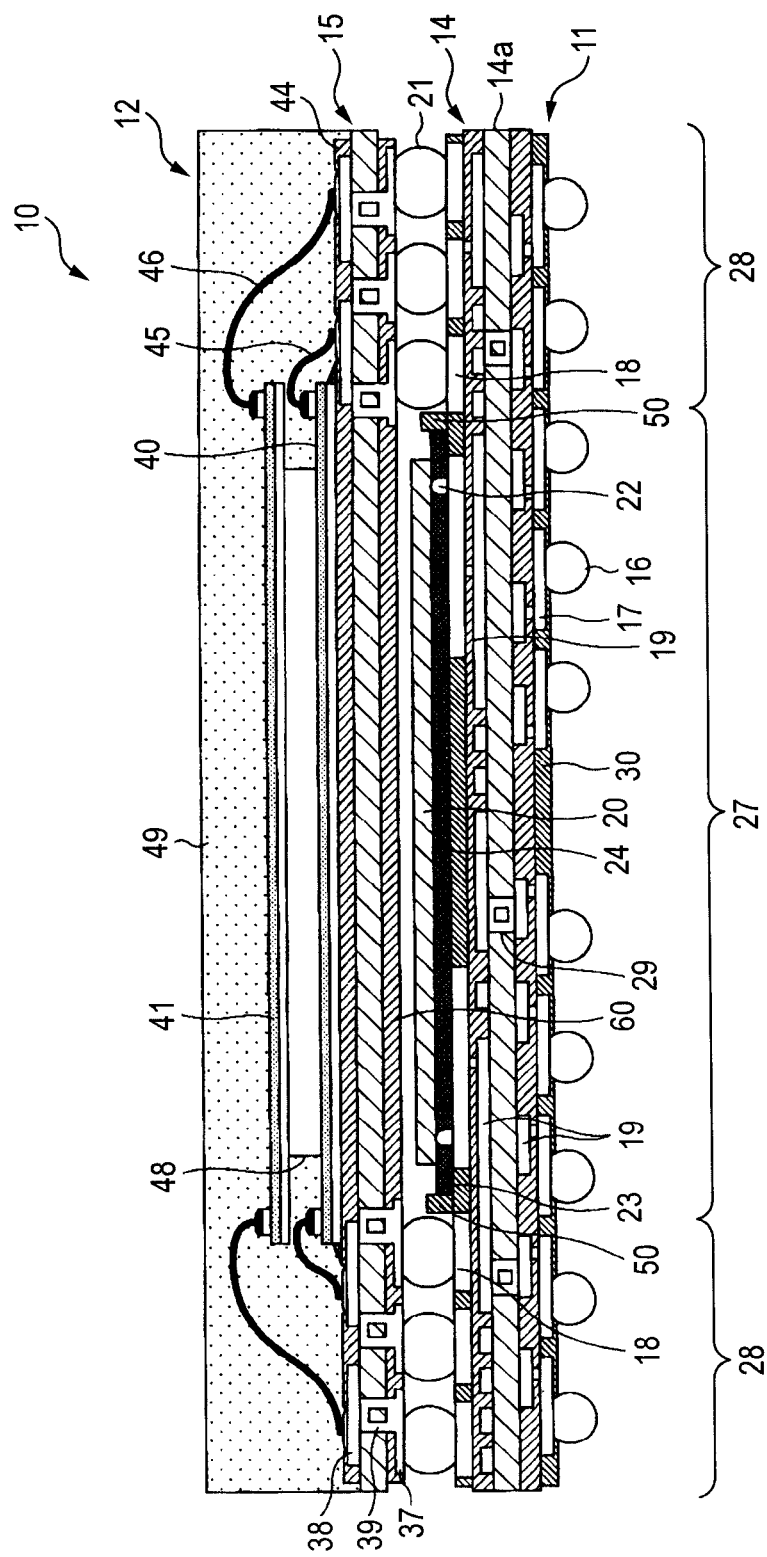
FIG. 1 is a sectional view showing a system in package as an electronic device according to an embodiment of the present invention.

FIG. 1 is a sectional view showing a system in package 10 as an electronic device according to an embodiment of the present invention. The system in package 10 shown in FIG. 1 is constructed by a lower layer package 11 and an upper layer package 12 when briefly classified.

The lower layer package 11 includes a lower layer mounting substrate 14, solder balls 16, lower electrodes 17, upper electrodes 18, a semiconductor chip 20, and the like. The lower layer mounting substrate 14 is the multi-layered wiring substrate, and wiring layers (e.g., Cu wiring layers), vias, etc. are formed on upper and lower surfaces of a substrate body 14a made of an insulating resin by using the plating method, or the like.

The upper electrodes 18 are formed on the uppermost layer of the substrate body 14a, and the lower electrodes 17 are formed on the lowermost layer. Also, the lower electrodes 17 and the upper electrodes 18 are connected using internal wirings 19 and vias 29.

Also, a lower solder resist 30 is formed on a lower surface of the lower layer mounting substrate 14, and an upper solder resist 24 is formed on an upper surface of the lower layer mounting substrate 14. Opening portions are formed in the upper solder resist 24 in positions that face the upper electrodes 18, and opening portions are formed in the lower solder resist 30 in positions where the lower electrodes 17 are formed. Therefore, respective electrodes 17, 18 are constructed to expose from the solder resists 24, 30 via these opening portions.

In addition, the solder balls 16 serving as external connection terminals of the system in package 10 are formed on the lower surface of the lower layer mounting substrate 14. The solder balls 16 are formed on the lower electrodes 17 exposed from the opening portions that are formed in the lower solder resist 30.

The upper electrodes 18 formed on the upper surface of the lower layer mounting substrate 14 are the electrodes to which stacking solder balls 21 are bonded, as described later. The upper electrodes 18 are formed to surround an area in which the semiconductor chip is provided (referred to as a "chip mounting area 27" hereinafter). Here, an area in which the upper electrodes 18 are formed on the lower layer mounting substrate 14 is called an electrode forming area 28 hereinafter.

The semiconductor chip 20 is a logic IC, for example, and is mounted on the lower layer mounting substrate 14 by flip-chip bonding. Concretely, bumps 22 are provided on the semiconductor chip 20, and the bumps 22 are flip-chip bonded to the upper wirings 19 formed on the upper surface of the lower layer mounting substrate 14. Thus, the semiconductor chip 20 is mounted on the lower layer mounting substrate 14. Also, an underfill resin 23 is provided between the semiconductor chip 20 and the lower layer mounting substrate 14 to enhance a bonding reliability. This underfill resin 23 is filled in the chip mounting area 27.

Also, a dam member 50 is formed on the upper surface of the lower layer mounting substrate 14. The dam member 50 blocks flow out of the underfill resin 23 from the chip mounting area 27 to the electrode forming area 28. For convenience of description, the dam member 50 will be described later.

In contrast, the upper layer package 12 includes an upper layer mounting substrate 15, semiconductor chips 40, 41, lower electrodes 37, upper electrodes 38, a sealing resin 49, and the like. The upper layer mounting substrate 15 is the multi-layered wiring substrate that is similar to the lower layer mounting substrate 14 described above. The upper electrodes 38 are formed on an upper surface of the upper layer mounting substrate 15, and the lower electrodes 37 are formed on a lower surface thereof Respective electrodes 37, 38 are connected mutually by internal wirings 39, and the like.

Also, a lower solder resist 60 is formed on a lower surface of the upper layer mounting substrate 15, and an upper solder resist 44 is formed on an upper surface thereof. Opening portions are formed in the upper solder resist 44 in respective positions that face the upper electrodes 38. Opening portions are formed in the lower solder resist 60 in respective positions in which the lower electrodes 37 are formed. Therefore, respective electrodes 37, 38 are constructed to expose from respective solder resists 44, 60 via the opening portions.

The semiconductor chips 40, 41 are the memory IC respectively, for example, and are stacked on the upper layer mounting substrate 15 via a spacer 48. Also, the semiconductor chips 40, 41 and the upper electrodes 38 formed on the upper layer mounting substrate 15 are connected electrically by wires 45, 46.

The sealing resin 49 is the insulating resin such as an epoxy resin, or the like, for example, and is formed to seal the semiconductor chips 40, 41 and the wires 45, 46. This sealing resin 49 may be formed using the transfer molding, for example.

The lower layer package 11 and the upper layer package 12 as described above are bonded mutually via the stacking solder balls 21 to constitute the system in package 10. The stacking solder balls 21 are bonded to the upper electrodes 18 of the lower layer mounting substrate 14, and also bonded to the lower electrodes 37 of the upper layer mounting substrate 15. Accordingly, the lower layer package 11 and the upper layer package 12 are connected electrically to each other, and the upper layer package 12 is supported such that this package 12 is stacked on the lower layer package 11.

Subsequently, the dam member 50 constituting a pertinent portion of the present invention will be mainly described with reference to FIGS. 3A and 3B. The dam member 50 is provided on the lower layer mounting substrate 14. Here, the semiconductor chip 20 is flip-chip bonded to the lower layer mounting substrate 14 and the upper electrodes 18 to which the stacking solder balls 21 are bonded are formed on the upper surface of the lower layer mounting substrate 14.

Figure 2:
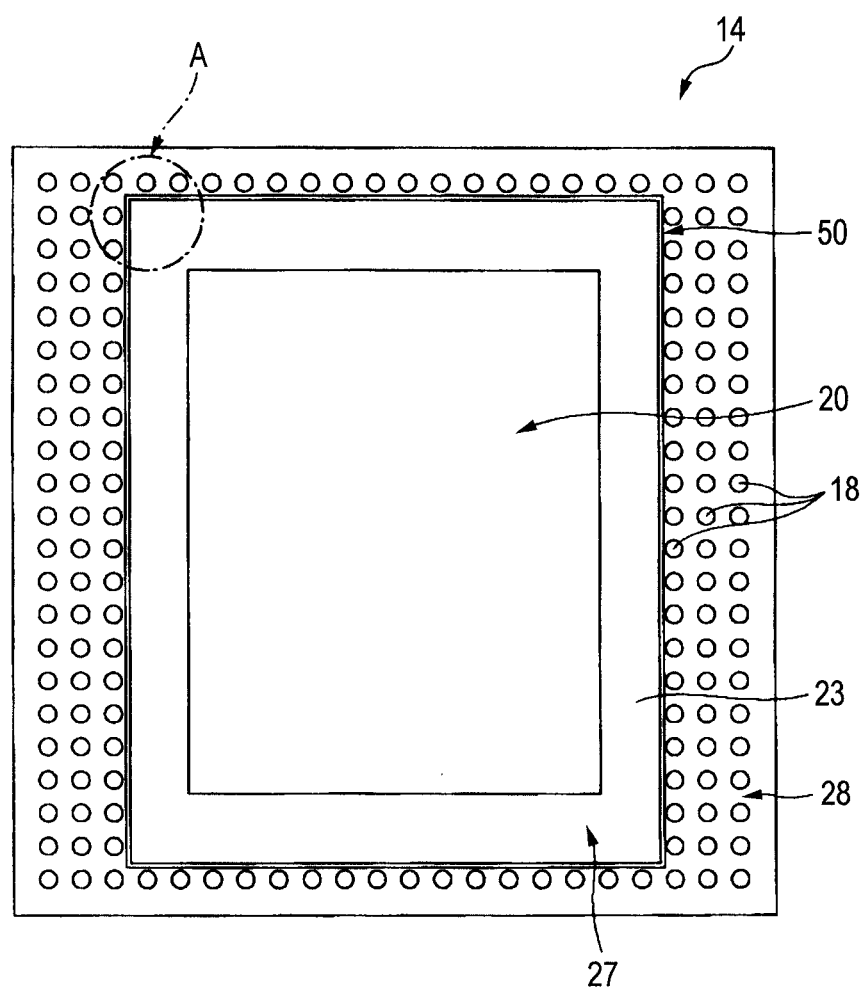
FIG. 2 is a plan view of a mounting substrate according to an embodiment of the present invention.
Figure 3A:
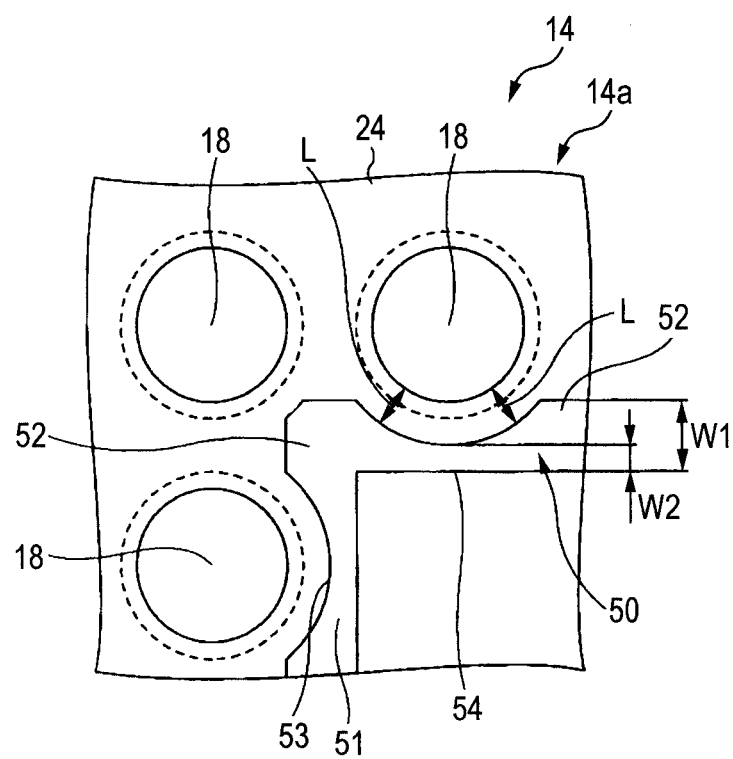
FIGS. 3A and 3B are enlarged views of a pertinent portion of the mounting substrate according to an embodiment of the present invention.
Figure 3B:
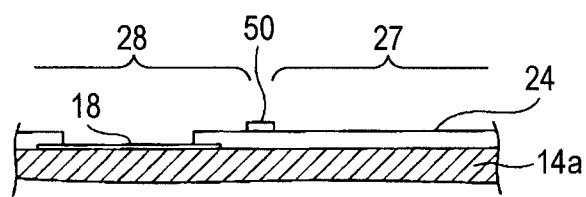
Figure 4A:
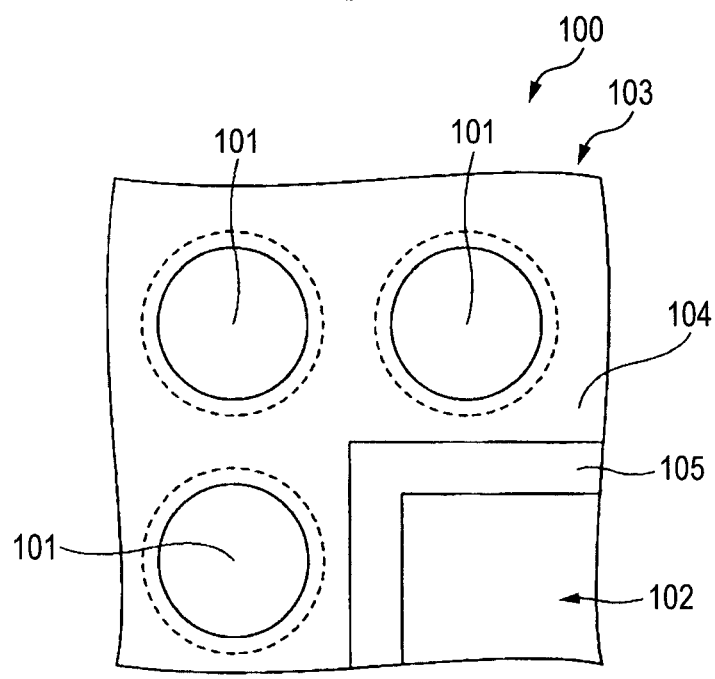
FIGS. 4A and 4B are views explaining a mounting substrate according to an example in the related-art.
Figure 4B:
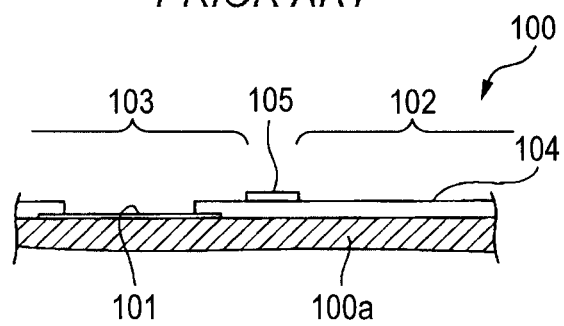

FIG. 3A is a view showing the forming position of the dam member 50 and its neighborhood on the lower layer mounting substrate 14, and FIG. 3B is a sectional view thereof. Next, the region shown in FIGS. 3A and 3B will be described with reference to FIG. 2 hereunder.

FIG. 2 is a plan view showing the lower layer mounting substrate 14 before the upper layer package 12 is stacked thereon. As shown in FIG. 2, the semiconductor chip 20 is mounted in a center portion of the electrode forming area 28, which is positioned on the inner side of the lower layer mounting substrate 14.

Also, a plurality of upper electrodes 18 are formed on the peripheral position of the lower layer mounting substrate 14 on the outside of the semiconductor chip 20 to form the electrode forming area 28. The dam member 50 is formed on the boundary between the chip mounting area 27 and the electrode forming area 28.

In order to relieve the stress caused between the semiconductor chip 20 and the lower layer mounting substrate 14, the underfill resin 23 is filled between the semiconductor chip 20 and the lower layer mounting substrate 14. However, because the underfill resin 23 has a flowability on filling, a part of the underfill resin 23 flows out to the outer periphery of the semiconductor chip 20.

However, the dam member 50 is provided to the outer peripheral edge of the chip mounting area 27 to block a further outflow. Therefore, such a situation can be prevented that the underfill resin 23 flows in the electrode forming area 28 and thus the electrode forming area 28 is covered with the underfill resin 23 to cause a connection failure. FIGS. 3A and 3B show enlarged view of an area which is indicated with an arrow A in FIG. 2, out of the lower layer mounting substrate 14 constructed as above.

The dam member 50 is formed on the boundary between the chip mounting area 27 and the electrode forming area 28 as described above. In order to block the flow out of the underfill resin 23 into the electrode forming area 28, this dam member 50 is formed like a frame shape to surround the chip mounting area 27.

This dam member 50 is formed integrally with the upper solder resist 24 being formed on the uppermost surface of the lower layer mounting substrate 14. Concretely, the dam member 50 is formed by coating a solder resist material up to a thickness (a height from the substrate surface) required for the dam member 50 in forming the upper solder resist 24, and then removing the solder resist material from an area except an area where the dam member 50 is formed through etching, or the like.

As a result, the dam member 50 is formed into one-piece structure with the upper solder resist 24, and is projected from the upper solder resist 24. Also, the dam member 50 can be easily formed because the dam member 50 is formed together in forming the upper solder resist 24.

Here, a shape of the dam member 50 shown in FIGS. 3A and 3B will be discussed hereunder. In the present embodiment, a recess portion 51 is formed on an outer peripheral surface of the dam member 50. The recess portion 51 is formed on the outer peripheral surface of the dam member 50 that faces the electrode forming area 28. Also, the recess portion 51 has a curved surface 53, and a part of the upper electrode 18 is positioned within the recess portion 51.

According to this configuration, a part of the dam member 50 is constructed to enter into the electrode forming area 28. Thus, the area of the chip mounting area 27 can be increased without changing the area of the electrode forming area 28 or with increasing the area of the electrode forming area 28. Also, the inner peripheral surface of the dam member 50 that face the chip mounting area 27 is formed into a linear inner peripheral surface 54. In this manner, because the inner peripheral surface 54 corresponding to the side where the underfill resin 23 is filled is formed into a linear shape, a filling efficiency of the underfill resin 23 can be enhanced and generation of a filling unevenness can be prevented.

By the way, because the upper electrodes 18 are arranged in grid-like fashion, a width of the dam member 50 can be enlarged in the clearance position between the upper electrodes 18, i.e., in the clearance position between the adjacent recess portions 51. Concretely, a width dimension of the dam member 50 in a position other than a position where the recess portion 51 is formed (referred to as a "first width dimension W1" hereinafter) can be formed larger than a width dimension of the dam member 50 in a position where the recess portion 51 is formed (referred to as a "second width dimension W2" hereinafter) (W1>W2). In the following, in the dam member 50, the portion whose width dimension is wider than the width dimension in the position where the recess portion 51 is formed is referred to as an anchor portion 52.

A bonding force between the recess portion 51 and the upper solder resist 24 is weak because the second width dimension W2 is narrower than that of the anchor portion 52. However, the first width dimension W1 can be set wider in the anchor portion 52. Also, because the anchor portion 52 can be formed to enter into the adjacent upper electrode 18, a margin to increase the first width dimension W1 is produced.

In this manner, the area of the anchor portion 52 can be increased by increasing the first width dimension W1, and thus the bonding force to the upper solder resist 24 can be enhanced. Therefore, even though the recess portion 51 is formed on the dam member 50 to increase the area of the chip mounting area 27 and reduce the area of the lower layer mounting substrate 14, both side portions of the recess portion 51 act as the anchor portion 52 to enhance the bonding force to the upper solder resist 24. Thus, a mechanical strength of the dam member 50 can be still maintained. As a result, even when the recess portion 51 is formed on the dam member 50, the dam member 50 is never damaged in filling the underfill resin 23, and the like, and thus reliability of the lower layer mounting substrate 14 can be increased.

Further, in the present embodiment, a curvature of the curved surface 53 constituting the recess portion 51 is set such that a distance (indicated with an arrow L in FIGS. 3A and 3B) from the curved surface 53 to an outer periphery of the upper electrode 18 can be always kept to the same distance. By employing such the configuration, even though some errors are caused in the forming position of the upper electrode 18 and the forming position of the dam member 50, such a situation can be prevented effectively that the dam member 50 is formed on the upper electrode 18.

In the above embodiment, while the recess portion 51 is formed to have the curved surface 53, the shape of the recess portion 51 is not limited to this shape, and can be changed appropriately in accordance with the shape of the upper electrode 18.

Also, in the present embodiment, while the present invention is applied to the exemplary embodiments in which the semiconductor chip 20 is mounted on the lower layer mounting substrate 14, the application of the present invention is not limited to the exemplary embodiments, and a wide variety of applications can be employed.

In addition, in the present embodiment, while the underfill resin 23 is used as an example of the filling material, the present invention can also be applied to other filling materials (e.g., the solder filling, and the like) required for the substrate of which the high packaging density is required.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

What is claimed is:

1. A mounting substrate comprising:
   a mounting area on which an electronic element is mounted;
   an electrode forming area on which electrodes are formed and which is formed to surround the mounting area; and
   a dam member which is formed on a boundary between the mounting area and the electrode forming area so as to block a filling material, which is being filled between the electronic element and the mounting substrate, from flowing out into the electrode forming area, wherein
   an outer peripheral surface of the dam member defines recess portions, each of said recess portions facing toward an associated one of the electrodes, and
   a clearance between the recess portion and the associated electrode facing the recess portion is set equal respectively within an area where the recess portion and the associated electrode face each other.

2. The mounting substrate according to claim 1, wherein a first width dimension of the dam member in a position other than a position where one of the recess portions is formed is larger than a second width dimension of the dam member in the position where one of the recess portions is formed.

3. The mounting substrate according to claim 1, wherein a solder resist is formed on a substrate body of the mounting substrate and the dam member is formed of the same material as the solder resist.

4. The mounting substrate according to claim 1, wherein an inner peripheral surface of the dam member that faces the mounting area is formed into a linear shape.

5. The mounting substrate according to claim 1, wherein the filling material is an underfill resin.

6. An electronic device comprising:
   an electronic element;
   a mounting substrate; and
   a filling material being filled between the electronic element and the mounting substrate,
   wherein the mounting substrate includes:
   a mounting area on which the electronic element is mounted;
   an electrode forming area on which electrodes are formed and which is formed to surround the mounting area; and
   a dam member that is formed on a boundary between the mounting area and the electrode forming area so as to block flow out of the filling material into the electrode forming area,
   wherein
   an outer peripheral surface of the dam member defines recess portions, each of said recess portions facing toward an associated one of the electrodes, and
   a clearance between the recess portion and the associated electrode facing the recess portion is set equal respectively within an area where the recess portion and the associated electrode face each other.

7. The electronic device according to claim 6, wherein a first width dimension of the dam member in a position other than a position where one of the recess portions is formed is larger than a second width dimension of the dam member in the position where one of the recess portions is formed.

8. The electronic device according to claim 6, wherein a solder resist is formed on a substrate body of the mounting substrate, the dam member is formed of the same material as the solder resist, and the solder resist and the dam member are integrally formed as a unitary piece.

9. The electronic device according to claim 6, wherein the outer peripheral surface of the dam member defines the recess portions as curved surfaces which are concave relative to the electrode forming area.

10. The electronic device according to claim 9, wherein inner peripheral surfaces of the dam member that face the mounting area and are disposed at positions opposite to the recess portions are formed into a linear shape.

11. The mounting substrate according to claim 3, wherein the solder resist and the dam member are integrally formed as a unitary piece.

12. The mounting substrate according to claim 1, wherein the outer peripheral surface of the dam member defines the recess portions as curved surfaces which are concave relative to the electrode forming area.

13. The mounting substrate according to claim 12, wherein inner peripheral surfaces of the dam member that face the mounting area and are disposed at positions opposite to the recess portions are formed into a linear shape.

* * * * *